(12) United States Patent
Li et al.

(10) Patent No.: US 7,311,852 B2
(45) Date of Patent: Dec. 25, 2007

(54) METHOD OF PLASMA ETCHING LOW-K DIELECTRIC MATERIALS

(75) Inventors: Si Yi Li, Fremont, CA (US); Helen H. Zhu, Fremont, CA (US); S. M. Reza Sadjadi, Saratoga, CA (US); James V. Tietz, Fremont, CA (US); Bryan A. Helmer, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 390 days.

(21) Appl. No.: 09/820,695

(22) Filed: Mar. 30, 2001

(65) Prior Publication Data

US 2003/0024902 A1    Feb. 6, 2003

(51) Int. Cl.
*H01L 21/3065* (2006.01)
(52) U.S. Cl. .............. 216/67; 216/39; 216/41; 216/72; 216/80; 438/710; 438/723; 438/729; 438/743
(58) Field of Classification Search ............... 216/39, 216/67, 72; 438/710, 725, 738
See application file for complete search history.

(56) References Cited

U.S. PATENT DOCUMENTS

| 5,013,398 A | 5/1991 | Long et al. |
| 5,013,400 A | 5/1991 | Kurasaki et al. |
| 5,021,121 A | 6/1991 | Groechel et al. |
| 5,022,958 A | 6/1991 | Favreau et al. |
| 5,269,879 A | 12/1993 | Rhoades et al. |
| 5,529,657 A | 6/1996 | Ishii |
| 5,595,627 A | 1/1997 | Inazawa et al. |
| 5,611,888 A | 3/1997 | Bosch et al. |
| 5,736,457 A | 4/1998 | Zhao |
| 5,780,338 A | 7/1998 | Jeng et al. |

(Continued)

FOREIGN PATENT DOCUMENTS

JP    2001118825 A    4/2001

(Continued)

OTHER PUBLICATIONS

Koshiishi et al., "Effect of Increasing the Upper Frequency on Dual Frequency Capacitive-Coupled-Plasma", Proceedings of Symposium on Dry Process, The Institute of Electrical Engineers of Japan, Nov. 11-13, 1998, pp. 229-234.*

(Continued)

*Primary Examiner*—Allan Olsen
(74) *Attorney, Agent, or Firm*—Buchanan Ingersoll & Rooney PC

(57) ABSTRACT

A semiconductor manufacturing process wherein a low-k dielectric layer is plasma etched with selectivity to an overlying mask layer. The etchant gas can be oxygen-free and include a fluorocarbon reactant, a nitrogen reactant and an optional carrier gas, the fluorocarbon reactant and nitrogen reactant being supplied to a chamber of a plasma etch reactor at flow rates such that the fluorocarbon reactant flow rate is less than the nitrogen reactant flow rate. The etch rate of the low-k dielectric layer can be at least 5 times higher than that of a silicon dioxide, silicon nitride, silicon oxynitride or silicon carbide mask layer. The process is useful for etching 0.25 micron and smaller contact or via openings in forming structures such as damascene structures.

23 Claims, 5 Drawing Sheets

U.S. PATENT DOCUMENTS

| | | | |
|---|---|---|---|
| 5,820,261 A | 10/1998 | Yam | |
| 5,843,847 A * | 12/1998 | Pu et al. | 438/723 |
| 6,054,379 A | 4/2000 | Yau et al. | |
| 6,074,959 A * | 6/2000 | Wang et al. | 438/738 |
| 6,090,304 A | 7/2000 | Zhu et al. | |
| 6,114,250 A | 9/2000 | Morey et al. | |
| 6,117,786 A * | 9/2000 | Khajehnouri et al. | 438/700 |
| 6,143,641 A | 11/2000 | Kitch | |
| 6,147,021 A | 11/2000 | Hahn et al. | |
| 6,153,514 A | 11/2000 | Wang et al. | |
| 6,153,935 A | 11/2000 | Edelstein et al. | |
| 6,156,642 A | 12/2000 | Wu et al. | |
| 6,159,792 A * | 12/2000 | Kim et al. | 438/254 |
| 6,168,726 B1 | 1/2001 | Li et al. | |
| 6,211,092 B1 * | 4/2001 | Tang et al. | 438/719 |
| 6,251,770 B1 * | 6/2001 | Uglow et al. | 438/624 |
| 6,284,149 B1 * | 9/2001 | Li et al. | 216/64 |
| 6,316,349 B1 * | 11/2001 | Kim et al. | 438/637 |
| 6,350,674 B1 * | 2/2002 | Okamura | 438/624 |
| 6,399,472 B1 * | 6/2002 | Suzuki et al. | 438/601 |
| 6,451,673 B1 * | 9/2002 | Okada et al. | 438/513 |
| 6,455,411 B1 * | 9/2002 | Jiang et al. | 438/624 |
| 6,465,359 B2 * | 10/2002 | Yamada et al. | 438/706 |
| 6,485,988 B2 * | 11/2002 | Ma et al. | 438/3 |
| 6,599,841 B2 * | 7/2003 | Komada | 438/706 |
| 6,607,675 B1 * | 8/2003 | Hsieh et al. | 216/67 |
| 6,617,244 B2 * | 9/2003 | Nishizawa | 438/637 |
| 6,632,746 B2 * | 10/2003 | Kanegae et al. | 438/706 |
| 6,660,647 B1 * | 12/2003 | Ono et al. | 438/714 |
| 6,670,276 B1 | 12/2003 | Suemasa et al. | |
| 6,693,042 B1 * | 2/2004 | Sedigh et al. | 438/714 |
| 6,753,263 B1 * | 6/2004 | Ito et al. | 438/714 |
| 6,764,606 B2 * | 7/2004 | Yanase | 216/75 |
| 6,967,171 B2 * | 11/2005 | Fujimoto et al. | 438/714 |
| 2003/0045101 A1 * | 3/2003 | Flanner et al. | 438/689 |
| 2003/0162407 A1 * | 8/2003 | Maex et al. | 438/725 |

FOREIGN PATENT DOCUMENTS

| | | |
|---|---|---|
| WO | WO00/67308 A | 11/2000 |
| WO | WO01/04707 A | 1/2001 |
| WO | WO/0203454 A | 1/2002 |

OTHER PUBLICATIONS

"After Moore's Law, Why Multiple Processors Matter", MacMusings by Dan Knight, (Nov. 2, 1999) (http://www.lowendmac.com/musings/moore.shtml).*

"Intel, IBM put chip development in fast lane", by Michael Kanellos (Dec. 10, 2000), (http://news.com.com/Intel%2C+IBM+put+chip+development+in+fast+lane/2100-1001_3-249656.html).*

Notification of Transmittal of the International Search Report or the Declaration for PCT/US02/06648 dated Nov. 20, 2002.

* cited by examiner

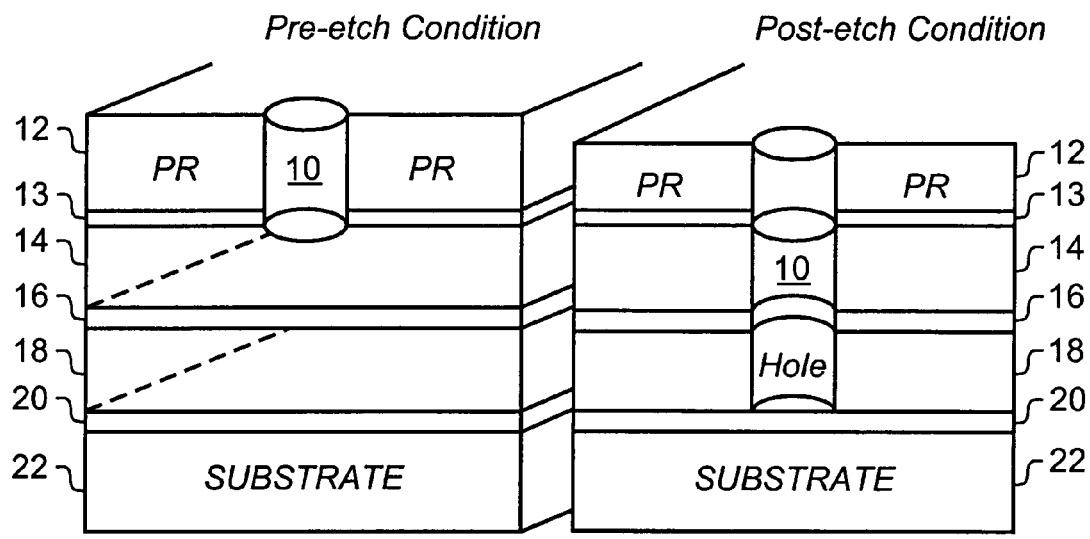
*FIG. 1A* *FIG. 1B*
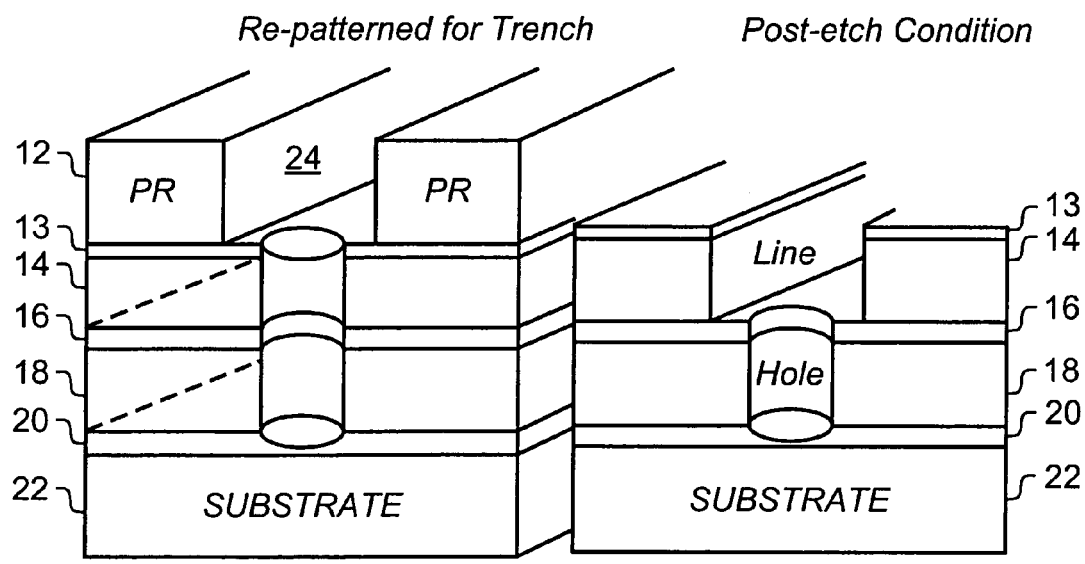
*FIG. 1C* *FIG. 1D*

Pre-etch Condition

Post-etch Condition

METHOD OF PLASMA ETCHING LOW-K DIELECTRIC MATERIALS

FIELD OF THE INVENTION

The present invention relates to an improved method for plasma etching low-k dielectric materials in the fabrication of integrated circuits.

BACKGROUND OF THE INVENTION

A common requirement in integrated circuit fabrication is the etching of openings such as contacts, vias and trenches in dielectric materials. The dielectric materials include doped silicon oxide such as fluorinated silicon oxide (FSG), undoped silicon oxide such as silicon dioxide, silicate glasses such as boron phosphate silicate glass (BPSG) and phosphate silicate glass (PSG), doped or undoped thermally grown silicon oxide, doped or undoped TEOS deposited silicon oxide, organosilicate glass, etc. The dielectric dopants include boron, phosphorus and/or arsenic. The dielectric can overlie a conductive or semiconductive layer such as polycrystalline silicon, metals such as aluminum, copper, titanium, tungsten, molybdenum or alloys thereof, nitrides such as titanium nitride, metal silicides such as titanium silicide, cobalt silicide, tungsten silicide, molydenum silicide, etc.

Various plasma etching techniques for etching openings in silicon oxide are disclosed in U.S. Pat. Nos. 5,013,398; 5,013,400; 5,021,121; 5,022,958; 5,269,879; 5,529,657; 5,595,627; 5,611,888; and 5,780,338. The plasma etching can be carried out in medium density reactors such as the parallel plate plasma reactor chambers described in the '398 patent or the triode type reactors described in the '400 patent or in high density reactors such as the inductive coupled reactors described in the '657 patent. Etching gas chemistries include the oxygen-free, Ar, $CHF_3$ and optional $CF_4$ gas mixture described in the '121 and '958 patents, the oxygen-free, fluorine-containing and nitrogen gas mixture described in the '879 patent, the $C_4F_8$ and CO gas mixture described in the '627 patent, the oxygen and $CF_4$ gas mixture described in the '400 patent, the oxygen, $CF_4$ and $CH_4$ gas mixture described in the '657 patent, and the Freon and neon gas mixture described in the '888 patent.

U.S. Pat. No. 5,736,457 describes single and dual "damascene" metallization processes. In the "single damascene" approach, vias and conductors are formed in separate steps wherein a metallization pattern for either conductors or vias is etched into a dielectric layer, a metal layer is filled into the etched grooves or via holes in the dielectric layer, and the excess metal is removed by chemical mechanical planarization (CMP) or by an etch back process. In the "dual damascene" approach, the metallization patterns for the vias and conductors are etched in a dielectric layer and the etched grooves and via openings are filled with metal in a single metal filling and excess metal removal process.

U.S. Pat. No. 6,153,514 discloses a method of forming a self-aligned dual damascene structure which includes a lower conductive layer (e.g., copper or copper alloy), a first etch stop layer (e.g., silicon nitride), a first dielectric layer (e.g., low k dielectric material wherein k<4), a second etch stop layer (e.g., silicon nitride), a second dielectric layer (e.g., low k dielectric material), a hard mask layer (e.g., silicon nitride), and a photoresist layer patterned to provide the feature to be etched into the second dielectric layer. According to this patent, the nitride hard mask layer is etched with $CHF_3/N_2$, the second dielectric layer is etched with $N_2/H_2O_2$ or $N_2/H_2$, the second etch stop layer is etched with $CHF_3/N_2$ and the first dielectric layer is etched with $C_4F_8/Ar/O_2/CO$.

U.S. Pat. No. 6,156,642 discloses a dual damascene structure wherein a semiconductor substrate includes a bottom metallization layer (e.g., copper), a topping layer (e.g., silicon nitride), a dielectric layer (e.g., silicon oxide or other low k material), a conformal layer (e.g., titanium, titanium nitride, tantalum, tantalum nitride, tungsten nitride) covering sidewalls of a trench and via hole, and a passivation layer (e.g., silicon nitride or silicon carbide). U.S. Pat. No. 6,143,641 discloses a dual damascene structure in an integrated circuit structure which includes an intermetal dielectric material (e.g., $SiO_2$) on an underlying conductive material (e.g., aluminum or copper), an adhesion layer (e.g., Ti, TiN, Ta) on exposed sidewalls of the dual damascene via structure which is filled with copper, a barrier metal or layer of silicon nitride, and additional layers including a low k dielectric material, silicon dioxide and silicon nitride.

U.S. Pat. No. 6,168,726 discloses a method of etching oxidized organo-silane films containing hydrogen, carbon, silicon and oxygen. This patent describes a carbon-based low-k material identified as byvinylsiloxane-benzocyclobutene (BCB) which contains a few percent of silicon but is otherwise an organic polymer containing carbon, oxygen and hydrogen. Another material disclosed in this patent is identified as Black Diamond marketed by Applied Materials, Inc., the film being an oxidized organo-silane film having, in atomic percent, 40-52% H, 5-11% C, 18-23% Si and 21-37% oxygen.

U.S. Pat. No. 6,153,935 discloses a damascene structure which includes a dielectric layer of silicon dioxide, polyimide, an organic siloxane polymer, poly-arylene ether, carbon-doped silicate glass or silsesquioxane glass, spin-on glass, fluorinated or non-fluorinated silicate glass, diamond-like amorphous carbon or other low dielectric constant material and a CMP stop layer in the form of a thin (about 20 to about 100 nm thick) layer of a dielectric silicon-based compound of low dielectric constant such as silicon nitride or silicon carbide, or a silicon-containing material of lower dielectric constants such as hydrogenated silicon carbide, silicon oxynitride or non-silicon-containing polymer such as one derived from benzocyclobutene.

U.S. Pat. No. 6,147,021 discloses a process for forming low dielectric constant (low-k) dielectric material wherein low-k materials are defined as those having a dielectric constant of 3.0 or less. U.S. Pat. No. 6,054,379 discloses a process of depositing a low-k dielectric layer on a patterned metal layer by reaction of an organosilane compound and an oxidizing compound.

U.S. Pat. No. 6,090,304 discloses a method of plasma etching semiconductor substrates in a dual frequency plasma reactor wherein a first radiofrequency (RF) source is coupled to a top showerhead electrode through an RF matching network and a bottom electrode (on which a semiconductor wafer is supported) is coupled to a second RF source through a second matching network.

As device geometries become smaller and smaller, the need for high etch selectivity ratios is even greater in order to achieve plasma etching of deep and narrow openings in dielectric layers such as low-k materials. Accordingly, there is a need in the art for a plasma etching technique which provides high etch selectivity ratios with respect to an overlying mask layer and/or which achieves deep and narrow openings.

SUMMARY OF THE INVENTION

The invention provides a process for plasma etching a low-k dielectric layer with selectivity to an overlying mask layer, comprising the steps of supporting the semiconductor substrate in a chamber of a plasma etch reactor, supplying an etching gas to the chamber and energizing the etching gas into a plasma state, and etching openings in the low-k dielectric layer with the plasma. The etching gas includes at least one nitrogen reactant, at least one fluorocarbon reactant, and an optional inert carrier gas, the fluorocarbon reactant and nitrogen reactant being supplied to the chamber at flow rates such that the fluorocarbon reactant flow rate is less than the nitrogen reactant flow rate.

According to one aspect of the invention, the overlying mask layer comprises a doped or undoped oxide film, a silicon nitride film, a silicon carbide film, a silicon oxynitride film or combination thereof. The openings can comprise grooves corresponding to a conductor pattern, via openings or contact openings. The openings can be etched so as to have an aspect ratio of at least 3:1. The etching gas can be oxygen-free and include a hydrogen-containing and/or a hydrogen-free fluorocarbon reactant represented by $C_xF_yH_z$ wherein x is at least 1, y is at least 1 and z is equal to or greater than 0. A preferred fluorocarbon reactant can be selected from the group of $C_4F_8$, $C_5F_8$, $C_4F_6$ and/or $CH_2F_2$. The semiconductor substrate can include an electrically conductive or semiconductive layer such as a metal-containing layer selected from the group consisting of Al, Al alloys, Cu, Cu alloys, Ti, Ti alloys, doped or undoped polycrystalline or single crystal silicon, TiN, TiW, Mo, silicides of Ti, W, Co and/or Mo or alloys thereof, etc.

The process of the invention can etch openings which are 0.30 µm, especially 0.25 µm or smaller sized openings using a fluorocarbon reactant which comprises $C_xF_yH_z$ wherein x is 1 to 5, y is 1 to 8 and z is 0 to 3. As an example, the fluorocarbon reactant can comprise a hydrogen-free fluorocarbon represented by $C_nF_m$ wherein n is 4 or more and m is 6 or more and an optional hydrogen-containing fluorocarbon reactant represented by $C_xF_yH_z$ wherein x is 1 or more, y is 1 or more and z is at least 1. The optional carrier gas can be selected from the group consisting of Ar, He, Ne, Kr, Xe or mixtures thereof. In a single wafer plasma etch chamber for processing 200 mm wafers, the fluorocarbon gas flow rate can be 30% or less of the nitrogen gas flow rate. For example, the fluorocarbon:nitrogen flow rate ratio can be 2 to 25%. In terms of flow rates, the fluorocarbon reactant can be supplied at a flow rate of 3 to 30 sccm, the nitrogen reactant can be supplied to the plasma reactor at a flow rate of 50 to 300 sccm, and the optional carrier gas can be supplied to the plasma reactor at a flow rate of 10 to 500 sccm. As an example, $C_5F_8$, $N_2$ and Ar can be supplied at flow rates of 10 to 25 sccm, 50 to 300 sccm, and 50 to 300 sccm, respectively. In another example, $C_4F_8$, $CF_2H_2$, $N_2$ and Ar can be supplied at flow rates of 2 to 20 sccm, 2 to 30 sccm, 50 to 300 sccm, and 50 to 300 sccm, respectively. During the etching step, the plasma reactor is preferably maintained at a vacuum pressure of 5 to 500 mTorr, preferably 150 to 250 mTorr in the case of a medium density plasma reactor. The etching step can be followed by additional etching steps and subsequent filling of the openings with metal. The method of the invention can also include steps of forming a photoresist layer on the substrate, patterning the photoresist layer to form a plurality of openings followed by etching a metallization pattern of conductor lines, via or contact openings in the overlying mask layer.

BRIEF DESCRIPTION OF THE DRAWINGS

FIGS. 1A-D show schematic representations of a via-first dual-damascene structure which can be etched according to the process of the invention, FIG. 1A showing a pre-etch condition, FIG. 1B showing a post-etch condition in which a via has been etched, FIG. 1C showing the structure re-patterned for a trench etch and FIG. 1D showing a post-etch condition in which the trench has been etched;

DETAILED DESCRIPTION OF THE INVENTION

Figures 2A, 2B:
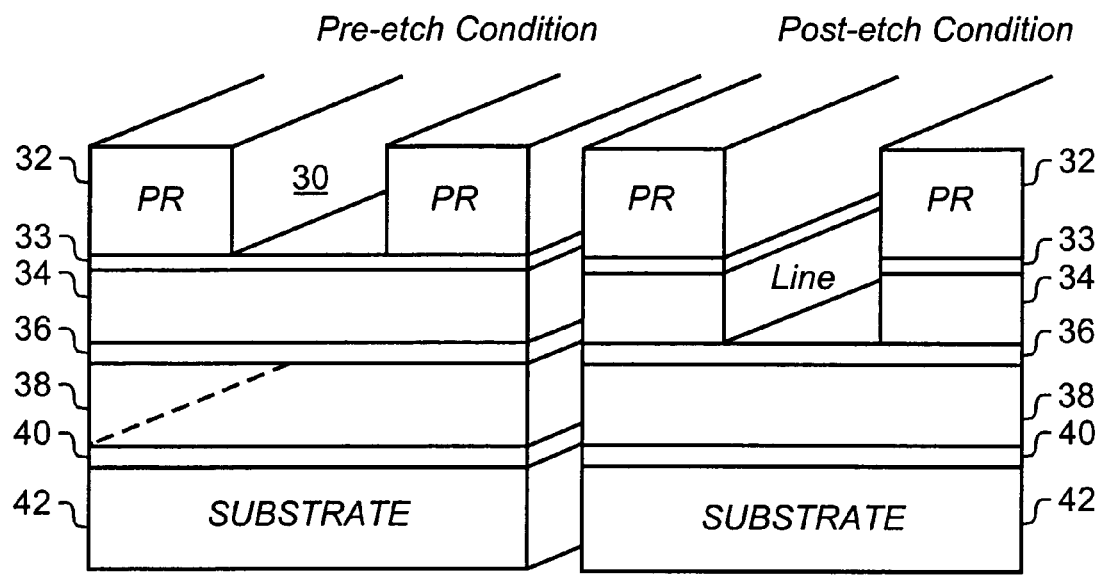
FIGS. 2A-D show schematic representations of a trench-first dual-damascene structure which can be etched according to the process of the invention, FIG. 2A showing a pre-etch condition, FIG. 2B showing a post-etch condition in which a trench has been etched, FIG. 2C showing the structure re-patterned for a via etch and FIG. 2D showing a post-etch condition in which the via has been etched.

The invention provides a semiconductor manufacturing process wherein openings can be plasma etched in low-k dielectric layers while providing desired selectivity to underlying and/or overlying dielectric layers such as silicon dioxide ($SiO_2$), silicon nitride ($Si_3N_4$), silicon carbide (SiC or HSiC), silicon oxynitride and photoresist materials (PR). Such selectivity is of great interest in the manufacture of damascene structures wherein one or more low-k dielectric layers are incorporated in a multilayer structure. During manufacture of such structures, features such as contacts, vias, conductor lines, etc. are etched in dielectric materials such as oxide and organosilicate glass layers in the manufacture of integrated circuits. The invention overcomes a problem with prior etching techniques wherein the selectivity between the low-k dielectric etch rate and the overlying mask/photoresist layers was too low for commercial applications. Such selectivity problems are solved by utilizing an etching gas chemistry which reduces the etch rates of the mask/photoresist layers relative to the low-k dielectric material.

According to one aspect of the invention, a single or dual-damascene etch process is provided wherein a low-k dielectric layer can be etched with 0.25 µm or smaller geometry to an etch depth of at least 1.8 µm with a low-k dielectric:mask etch rate selectivity of greater than 5:1. The process can provide a low or reversed RIE lag, which can allow multi-level dielectric etch applications and enable the fabrication of dual-damascene devices.

FIGS. 1A-D show schematics of how a via-first dual-damascene structure can be etched in accordance with the invention. FIG. 1A shows a pre-etch condition wherein an opening 10 corresponding to a via is provided in a photoresist masking layer 12 which overlies a stack of layers including a mask 13 of silicon dioxide, silicon nitride, silicon carbide, silicon nitride, or the like, a first low-k dielectric layer 14, a first stop layer 16 such as silicon nitride or silicon carbide, a second low-k dielectric layer 18, a second stop layer 20 such as silicon nitride or silicon carbide, and a substrate 22 such as a silicon wafer which may include an electrically conductive layer (not shown) and other layers such as barrier layers (not shown) beneath the etch stop layer 20. FIG. 1B shows the structure after etching wherein the opening 10 extends through the mask 13, the low-k dielectric layers 14, 18 and first stop layer 16 to the second stop layer 20. FIG. 1C shows the structure after re-patterning the masking layer for a trench 24. FIG. 1D shows the structure after stripping of the photoresist and etching wherein the first low-k dielectric layer 14 is etched down to the first stop layer 16.

Figures 2C, 2D:
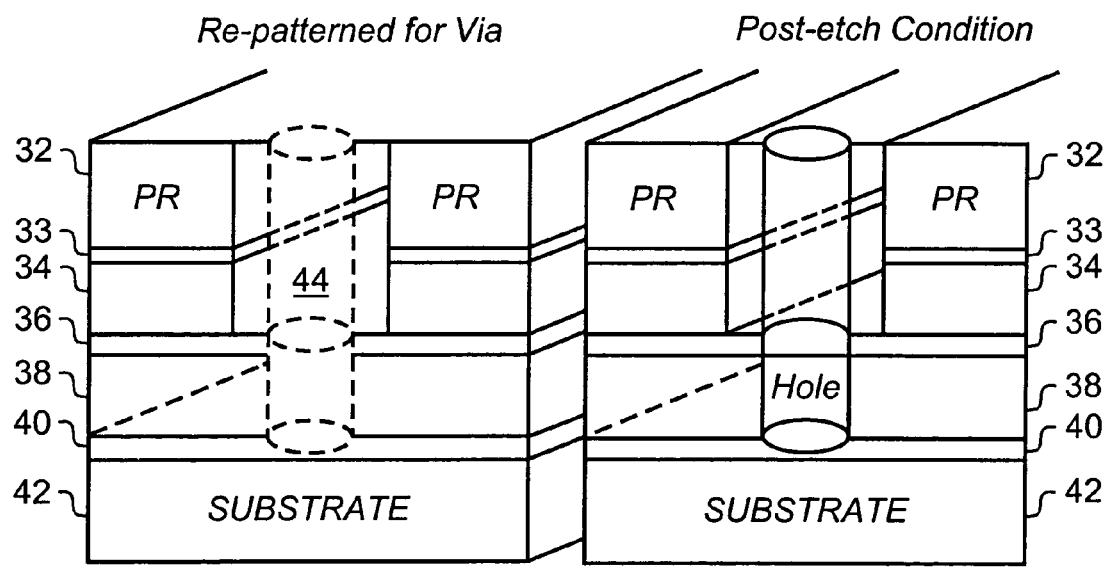

FIGS. 2A-D show schematics of how a trench-first dual-damascene structure can be etched in accordance with the invention. FIG. 2A shows a pre-etch condition wherein an opening 30 corresponding to a trench is provided in a photoresist masking layer 32 which overlies a stack of layers including a mask layer 33, a first low-k dielectric layer 34, a first stop layer 36 such as silicon nitride or silicon carbide, a second low-k dielectric layer 38, a second stop layer 40 such as silicon nitride or silicon carbide, and a substrate 42 such as a silicon wafer which may further include metallization and barrier layers (not shown) beneath the stop layer 40. FIG. 2B shows the structure after etching wherein the opening 30 extends through the low-k dielectric layer 34 to the first stop layer 36. FIG. 2C shows the structure after re-patterning for a via 44. FIG. 2D shows the structure after etching wherein the second low-k dielectric layer 38 is etched down to the second stop layer 40.

Figure 3A:
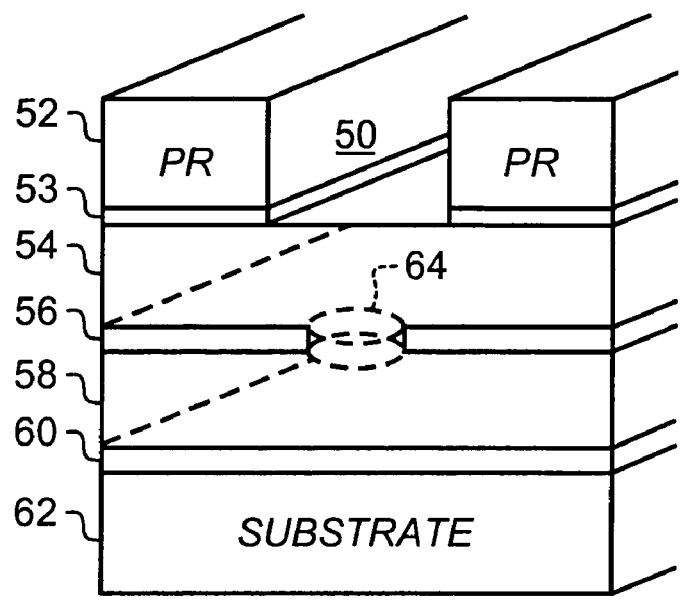
FIGS. 3A-B show schematic representations of a self-aligned dual-damascene structure which can be etched according to the process of the invention, FIG. 3A showing a pre-etch condition and FIG. 3B showing a post-etch condition in which a trench and a via have been etched.
Figure 3B:
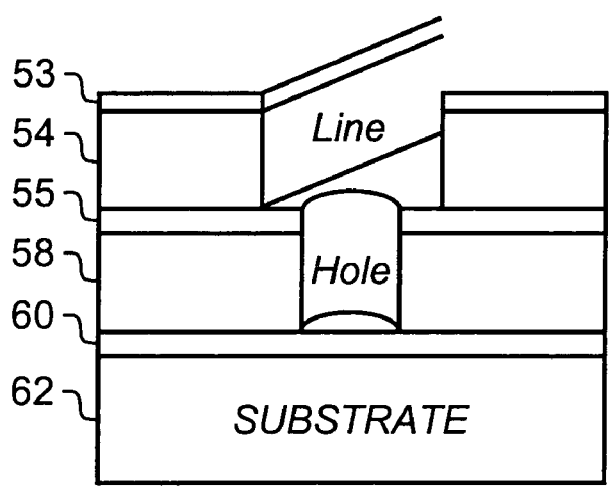

FIGS. 3A-B show schematics of how a dual-damascene structure can be etched in a single step in accordance with the invention. FIG. 3A shows a pre-etch condition wherein an opening 50 corresponding to a trench is provided in a photoresist 52 and a masking layer 53 which overlies a stack of layers including a first low-k dielectric layer 54, a first stop layer 56 such as silicon nitride or silicon carbide, a second low-k dielectric layer 58, a second stop layer 60 such as silicon nitride or silicon carbide, and a substrate 62 such as a silicon wafer which can include metallization and barrier layers (not shown) beneath the stop layer 60. In order to obtain etching of vias through the first stop layer 56 in a single etching step, first stop layer 56 includes an opening 64. FIG. 2B shows the structure after etching wherein the opening 50 extends through the low-k dielectric layer 54 to the first stop layer 56 and the opening 64 extends through the second low-k dielectric 58 to the second stop layer 60. Such an arrangement can be referred to as a "self-aligned dual-damascene" structure.

The process of the invention is applicable to etching of various low-k dielectric layers including doped silicon oxide such as fluorinated silicon oxide (FSG), silicate glasses such as boron phosphate silicate glass (BPSG) and phosphate silicate glass (PSG), organic polymer materials such as polyimide, organic siloxane polymer, poly-arylene ether, carbon-doped silicate glass, silsesquioxane glass, fluorinated and non-fluorinated silicate glass, diamond-like amorphous carbon, aromatic hydrocarbon polymer such as SiLK (a product available from Dow Chemical Co.), c-doped silica glass such as CORAL (a product available from Novellus Systems, Inc.), or other suitable dielectric material having a dielectric constant below 4.0, preferably below 3.0. The low-k dielectric can overlie an intermediate layer such as a barrier layer and a conductive or semiconductive layer such as polycrystalline silicon, metals such as aluminum, copper, titanium, tungsten, molybdenum or alloys thereof, nitrides such as titanium nitride, metal silicides such as titanium silicide, cobalt silicide, tungsten silicide, molydenum silicide, etc.

The plasma can be produced in various types of plasma reactors. Such plasma reactors typically have energy sources which use RF energy, microwave energy, magnetic fields, etc. to produce a medium to high density plasma. For instance, a high density plasma could be produced in a transformer coupled plasma (TCP™) etch reactor available from Lam Research Corporation which is also called inductively coupled plasma reactor, an electron-cyclotron resonance (ECR) plasma reactor, a helicon plasma reactor, or the like. An example of a high flow plasma reactor which can provide a high density plasma is disclosed in commonly owned U.S. Pat. No. 5,820,261, the disclosure of which is hereby incorporated by reference. The plasma can also be produced in a parallel plate etch reactor such as the dual frequency plasma etch reactor described in commonly owned U.S. Pat. No. 6,090,304, the disclosure of which is hereby incorporated by reference.

Figure 4:
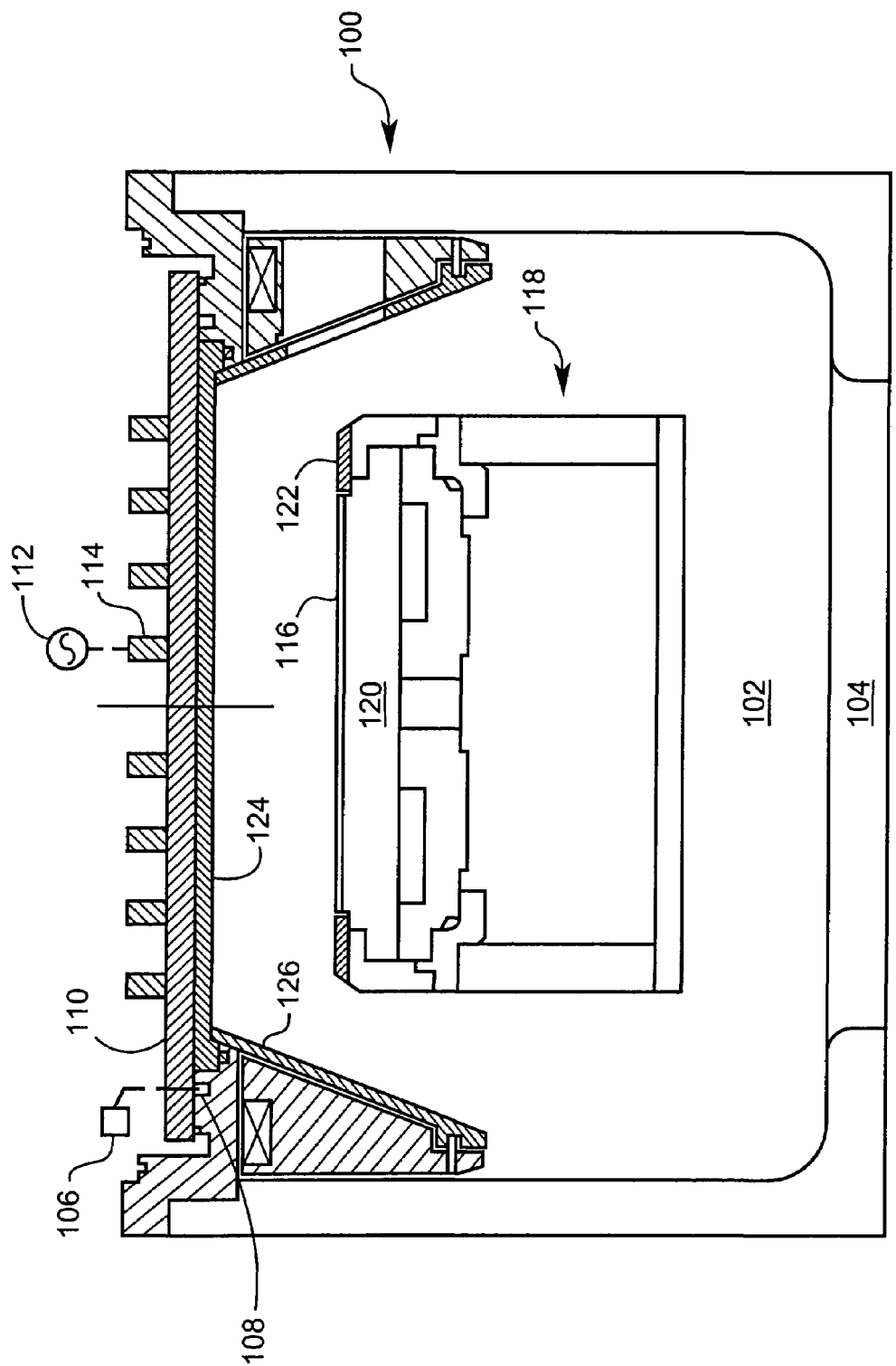
FIG. 4 shows a schematic representation of an inductively coupled high density plasma reactor which can be used to carry out the process of the invention.

The process of the invention can be carried out in an inductively coupled plasma reactor such as reactor 100 shown in FIG. 4. The reactor 100 includes an interior 102 maintained at a desired vacuum pressure by a vacuum pump connected to an outlet 104 in a lower wall of the reactor. Etching gas can be supplied to a showerhead arrangement be supplying gas from gas supply 106 to a plenum 108 extending around the underside of a dielectric window 110. A high density plasma can be generated in the reactor by supplying RF energy from an RF source 112 to an external RF antenna 114 such as a planar spiral coil having one or more turns outside the dielectric window 110 on top of the reactor. The plasma generating source can be part of a modular mounting arrangement removably mounted in a vacuum tight manner on the upper end of the reactor.

A semiconductor substrate 116 such as a wafer is supported within the reactor on a substrate support 118 such as a cantilever chuck arrangement removably supported by a modular mounting arrangement from a sidewall of the reactor. The substrate support 118 is at one end of a support arm mounted in a cantilever fashion such that the entire substrate support/support arm assembly can be removed from the reactor by passing the assembly through an opening in the sidewall of the reactor. The substrate support 118 can include a chucking apparatus such as an electrostatic chuck 120 and the substrate can be surrounded by a dielectric focus ring 122. The chuck can include an RF biasing electrode for applying an RF bias to the substrate during an etching process. The etching gas supplied by gas supply 106 can flow through channels between the window 110 and an underlying gas distribution plate 124 and enter the interior 102 through gas outlets in the plate 124. The reactor can also include a cylindrical or conical heated liner 126 extending from the plate 124.

Figure 5:
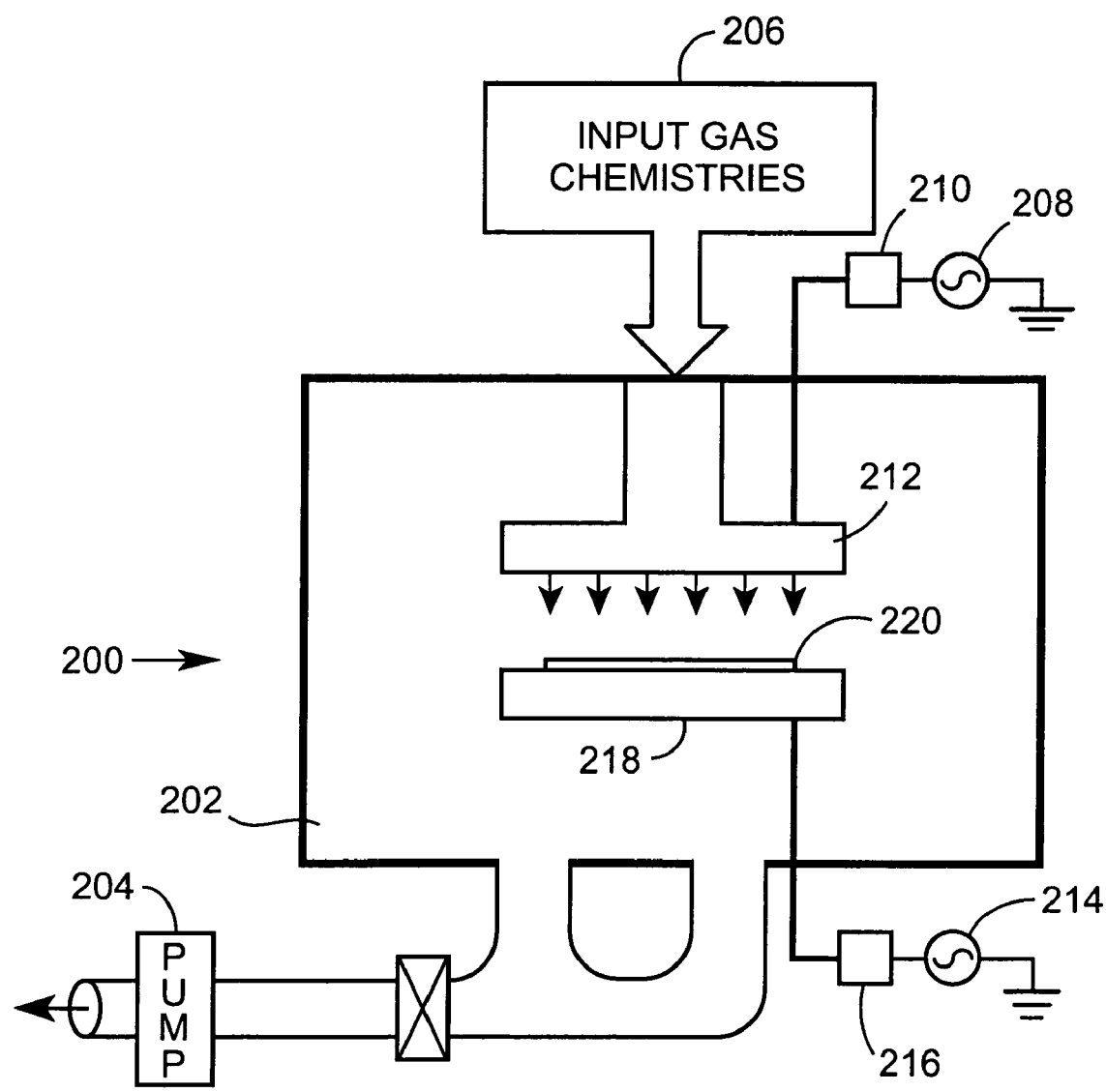
FIG. 5 shows a schematic representation of a medium density parallel plate plasma reactor which can be used to carry out the process of the invention

The process of the invention can also be carried out in a parallel plate plasma reactor such as reactor 200 shown in FIG. 5. The reactor 200 includes a chamber having an interior 202 maintained at a desired vacuum pressure by a vacuum pump 204 connected to an outlet in a wall of the reactor. Etching gas can be supplied to a showerhead electrode by supplying gas from gas supply 206. A medium density plasma can be generated in the reactor by a dual frequency arrangement wherein RF energy from RF source 208 is supplied through a match network 210 to a showerhead electrode 212 and RF energy from RF source 214 is supplied through a match network 216 to a bottom electrode 218. Alternatively, the showerhead electrode 212 can be electrically grounded and RF energy at two different frequencies can be supplied to the bottom electrode 218. A substrate 220 supported on the bottom electrode 218 can be etched with plasma generated by energizing the etch gasses into a plasma state. Other types of capacitively coupled reactors can also be used such as those having RF power supplied either to a showerhead electrode or to a bottom electrode.

In one embodiment, the invention provides a process for plasma etching 0.3 μm and smaller high aspect ratio features such as conductor lines, vias and contacts including self aligned contacts (SAC) in low-k dielectric layers on semiconductor substrates. In the process, a gas mixture containing fluorocarbon, nitrogen and optional gases such as a carrier gas (e.g., argon) is energized in a plasma etch reactor into a plasma state such that the fluorocarbon and the nitrogen reactant are at least partially dissociated. During the etching process, the low-k dielectric layer is etched by the fluorine and the carbon reacts with some free F to thereby reduce the etch rate of the masking and/or stop etch layers. The nitrogen is effective in providing a desired level of selectivity between the etch rates of the low-k dielectric material being etched and an overlying mask layer such as silicon dioxide, silicon oxynitride, silicon nitride layer, a desired selectivity to an underlying etch stop layer such as silicon carbide or silicon nitride and/or a desired selectivity to an overlayer such as a photoresist while at the same time balancing polymer build-up sufficiently to protect sidewalls of etched features while avoiding pinch-off and etch stop problems due to excessive polymer build-up. Etch stop is especially problematic during plasma etching of deep and narrow openings in dielectric materials using gas chemistries which form too much polymer, i.e., polymer-build-up in the opening prevents further etching of the opening. In the process of the invention, the polymer build-up can be reduced by the synergistic effect of breaking up precursor polymer compounds in the plasma such as $CF_2$ and/or $CH_2$ with the nitrogen in the etching gas mixture. Further, in order to preserve the critical dimension (CD) of the etched feature, the nitrogen may remove and/or prevent formation of polymer build-up so as to avoid excessive build-up of polymer on the sidewalls which otherwise could cause "pinch-off" of the etched openings and thus prevent complete etching of the opening to the desired depth.

According to the invention, nitrogen is added in an amount effective to control the etch rate selectivity of the etching gas chemistry. That is, when using an etching gas containing nitrogen and one or more fluorocarbon gases, the nitrogen is effective to free up F by scavenging C and/or H or breaking up $CF_2$ and/or $CH_2$ from the fluorocarbon in the plasma or deposited as an etch byproduct. However, by supplying nitrogen at a suitable level it is possible to increase the selectivity ratio and prevent etch stop by reacting with polymer at the bottom of the etched openings. For a medium density plasma reactor, the advantageous effects of the invention can be achieved by supplying the nitrogen reactant and fluorocarbon reactant to the plasma etching reactor such that the flow rate of the fluorocarbon is less than that of the nitrogen. For example, the flow rate ratio of fluorocarbon reactant can be selected so as to be 50% or less, preferably 30% or less of the flow rate of the nitrogen.

The etching gas mixture may optionally include other gases such as low amounts of oxygen and/or an inert carrier gas. In a preferred embodiment, the etch gas is oxygen-free to avoid attack of a silicon carbide etch stop layer by oxygen. Argon is an especially useful inert carrier gas which can be used to aid fluorine in etching a low-k dielectric layer such as CORAL. However, other inert gases such as He, Ne, Kr and/or Xe can be used as the inert carrier gas. In order to maintain low pressure in the plasma etching reactor, the amount of carrier gas introduced into the reactor can be at a low flow rate. For instance, for a medium to high density plasma reactor, argon can be supplied into the reactor in amounts of 25 to 500, preferably 50 to 300 sccm. The carrier gas preferably aids the low-k dielectric etch rate, e.g., the low-k dielectric etching rate can be increased due to sputtering of the low-k dielectric.

The fluorocarbon preferably comprises $C_xF_yH_z$ wherein x is at least 1, y is at least 1 and z is 0 or above, e.g., $CF_4$, $C_3F_6$, $C_3F_8$, $C_5F_8$, $C_4F_8$, $C_2F_6$, $CH_2F_2$, $C_2HF_5$, $CH_3F$, $CHF_3$, etc. A preferred fluorocarbon is represented by $C_nF_m$ wherein $n \geq 4$ and $m \geq 6$. When using a hydrogen-containing fluorocarbon gas which can be quite polymerizing, the degree of polymerizing can be controlled to achieve deep and narrow openings through the use of a synergistic combination of the nitrogen reactant and the fluorocarbon reactant. The amounts of fluorocarbon and nitrogen gases to be supplied to the plasma reactor are preferably sufficient to achieve the desired degree of polymerizing. As an example, nitrogen and fluorocarbon reactants can be supplied at flow rates of 50 to 300 sccm and 3 to 20 sccm, respectively. As an example, for 0.25 μm diameter contact openings, the nitrogen reactant flow rate can range from 50 to 200 sccm when $C_xF_yH_z$ is supplied at 5 to 20 sccm, and argon, if supplied, can range from 50 to 500 sccm. It will be apparent to those skilled in the art that the flow rates of the various gases will depend on factors such as the type of plasma reactor, the power settings, the vacuum pressure in the reactor, the dissociation rate for the plasma source, etc.

The process of the invention is useful for obtaining extremely high aspect ratios of at least 5:1, the process being especially useful for obtaining aspect ratios up to 10:1 for openings smaller than 0.3 μm, preferably as small as 0.18 and below. For example, it is possible to obtain substantially straight walls for 0.25 μm diameter openings at depths greater than 2.1 μm. In order to provide anisotropic etching, it is beneficial to supply an RF bias to the semiconductor substrate by the substrate support. For instance, an RF biasing electrode in the substrate support can be supplied with power on the order of 50 to 1000 Watts to adequately RF bias 6, 8 or even 12 inch wafers.

The reactor pressure is preferably maintained at a level suitable for sustaining a plasma in the reactor. In general, too low a reactor pressure can lead to plasma extinguishment whereas in a high density etch reactor too high a reactor pressure can lead to the etch stop problem. For high density plasma reactors, the reactor is preferably at a pressure below 30 mTorr, more preferably below 10 mTorr. For medium density plasma reactors, the reactor is preferably at a pressure above 30 mTorr, more preferably above 50 mTorr, e.g., 60 to 200 mTorr. Due to plasma confinement at the semiconductor substrate undergoing etching, the vacuum pressure at the substrate surface may be higher than the vacuum pressure setting for the reactor.

The substrate support supporting the semiconductor substrate undergoing etching preferably cools the substrate enough to prevent burning of any photoresist on the substrate, e.g., maintain the substrate below 140° C. In high and medium density plasma reactors, it is sufficient to cool the substrate support to a temperature of −20 to 50° C. The substrate support can include a bottom electrode for supplying an RF bias to the substrate during processing thereof and an ESC for clamping the substrate. For example, the substrate can comprise a silicon wafer which is electrostatically clamped and cooled by supplying helium at a desired pressure between the wafer and top surface of the ESC. In order to maintain the wafer at a desired temperature of, for example, 0 to 100° C., the He can be maintained at a pressure of 2 to 30 Torr in the space between the wafer and the chuck.

The invention provides a process for etching low-k dielectric materials such as carbon-doped siloxane layers and other low-k dielectric materials which are being used in low-k dielectric/copper and damascene and dual-damascene structures in place of traditional $SiO_2$/aluminum structures. A significant challenge involves the dry photoresist strip process because the chemical structure of many low-k materials differs from and is less passive than that of the conventional silicon dioxide dielectric. As a result, the dry strip processes can attack the mask layer, cause unacceptable undercutting (insufficient selectivity) and fundamentally alter low-k film properties. A chemical vapor deposited (CVD) low-k dielectric available from Novellus is the CORAL family of low-k films which are thermally stable to 500° C. and have a dielectric constant of 2.7. Such low-k materials can be arranged in a multilayer stack which includes an upper silicon dioxide or silicon nitride hard mask which is below an antireflective coating covered by a patterned photoresist. While doped silicon oxide films are not substantially etched by conventional oxygen-based, dry resist strip processes, the Si—$CH_3$ and Si—C bonds in low-k films may be readily susceptible to attack by the active oxygen species of the dry strip plasma discharge. In the presence of oxygen radicals, these bonds are broken and replaced by Si—O bonds resulting in a more $SiO_2$-like film with a higher dielectric constant. The loss of the Si—$CH_3$ and Si—C bonds also increases the film's refractive index and film stress which may be high enough to crack the film. In accordance with one embodiment of the invention, oxygen degradation of low-k films can be minimized by using an oxygen-free or low oxygen etch gas for etching organic low-k material.

Besides CORAL, commercially available low-k materials include organic low-k materials such as BCB, Flare, SiLK and Parylene AF4 whereas doped oxide low-k materials available commercially include CORAL, HOSP and HSQ.

The low-k dielectric etching process according to the invention can be used in providing openings such as vias and trenches in damascene structures containing one or more silicon carbide or silicon nitride layers. In etching such structures, it is desirable to provide a selectivity to the overlying photoresist and/or mask layer of at least 5:1, preferably at least 10:1, and more preferably at least 15:1. In general, the etch gas includes a fluorocarbon reactant, a nitrogen-containing reactant and an optional carrier gas. As an example, the etch gas can comprise $C_5F_8$, $N_2$ and Ar with a $C_5F_8/N_2$ flow ratio effective to achieve the desired selectivity with respect to photoresist, silicon carbide and/or silicon nitride layers. For instance, the low-k dielectric layer may be located above a thin (e.g., about 40 to 50 nm) silicon carbide etch stop layer. In testing various fluorocarbon gases, it has been discovered that $C_4F_6$ provides low selectivity to silicon carbide, $C_4F_8$ provides better selectivity with increased amounts of the $C_4F_8$ compared to the $N_2$ flow rate and $C_5F_8$ provides the best selectivity using a lower ratio of $C_5F_8$ to $N_2$ flow rates. In order to avoid etching the silicon carbide, it is desirable to maintain oxygen at a low level. In a preferred embodiment, the etch gas is oxygen-free in order to avoid etching the silicon carbide layer.

According to a second embodiment of the invention, the fluorocarbon gas can be a hydrogen-containing fluorocarbon gas. The hydrogen-containing fluorocarbon gas can be mixed with a hydrogen-free fluorocarbon gas. Examples of hydrogen-containing fluorocarbon gases include $CH_3F$, $CH_2F_2$, $CHF_3$, $C_2HF_5$, $CH_3F$ and $C_2H_4F_6$. The hydrogen-free fluorocarbon gas can be represented by $C_nF_m$ where n is 4 or more and m is 6 or more and the hydrogen-containing fluorocarbon reactant can be represented by $C_xF_yH_z$ wherein x is 1 or more, y is 1 or more and z is at least 2. Suitable $C_nF_m$ gases include $C_4F_8$, $C_5F_8$, $C_4F_6$. If desired, the etch gas can include other CF gases such as $CF_4$, $C_2F_6$, $C_3F_6$, $C_3F_8$.

The nitrogen and fluorocarbon cooperate to provide a desired degree of polymer buildup during etching of the openings. The nitrogen also is effective in diluting the plasma. The carrier gas can be added in an amount sufficient for maintaining the plasma and providing ion directionality in order to avoid isotropic etching. However, too much carrier gas and/or too much power may cause faceting of the etched openings.

A preferred etch reactor for carrying out the process of the invention is a parallel plate capacitively coupled etch reactor. The reactor can be a dual-frequency reactor wherein power at two different frequencies is used to energize the plasma and provide the desired RF bias on the substrate being etched. The plasma provided by such a reactor is understood in the art to be a medium density plasma which differs substantially from the high density plasma produced in inductively coupled reactors, ECR reactors and other high density plasma sources such as helicon, magnetron and other high density type plasma chambers. In a preferred embodiment, the dual frequency etch chamber is maintained at a pressure of 80 to 300 mTorr, the power supplied to the electrodes ranges from 800 to 2000 watts (e.g., 1000 watts at 2 MHz and 1000 W at 27 MHz), the substrate support is maintained at a temperature of from −10° C. to 50° C., the etch gas includes a hydrogen-free fluorocarbon supplied to the reactor at 3 to 20 sccm, nitrogen supplied at 50 to 300 sccm, argon supplied at 50 to 500 sccm, and the $C_xF_y/N_2$ flow rate is less than 10%, preferably 3 to 9%.

Table 1 sets forth estimated low-k dielectric etch rates operating the above described dual frequency reactor at a reactor pressure set at 75 mTorr, 1000 watts power to the showerhead electrode, 1000 watts power to the bottom electrode, and varying the flow rates of the gases as shown in the table. As shown in Table 1, $C_4F_8$ provided low-k dielectric etch rates of at least 3000 Å/min when the $C_xF_y/N_2$ flow ratio was at least 5%. In contrast, $C_5F_8$ provided a low-k dielectric etch rate above 3000 Å/min when the $C_xF_y/N_2$ flow ratio was around 5%. Because the low-k dielectric etch rate was around 1400 Å/min when the $C_xF_y/N_2$ flow ratio was 2% and 8%, respectively, it is estimated that the low-k dielectric etch rate using $C_5F_8$ can be maintained above 3000 Å/min when the $C_xF_y/N_2$ flow ratio is about 3 to 7%. $C_4F_6/N_2$ flow ratios of 2 to 17% provided low-k dielectric etch rates of 400 to 1300 Å/min.

TABLE 1

Low-k Dielectric Etch Rate (Å/min)

| Flow Ratio $C_xF_y/N_2$ (%) | $C_4F_6/N_2$ | $C_5F_8/N_2$ | $C_4F_8/N_2$ |
| --- | --- | --- | --- |
| 2 | 1000 | 1400 | 1200 |
| 5 | 1300 | 3600 | 3000 |
| 8 | 700 | 1400 | 5000 |
| 12 | 500 | 1000 | 6000 |
| 14 | 500 | 600 | 5000 |
| 17 | 400 | | 5000 |
| 24 | | | 5000 |

Table 2 sets forth estimated silicon carbide etch rates obtained when operating the dual frequency reactor at 75 mTorr, 1000 watts power to the top electrode, 1000 watts to the bottom electrode with variations in flow ratio of $C_xF_y/N_2$ using various $C_xF_y$ gases. The $C_xF_y$ gases include $C_4F_6$, $C_5F_8$ and $C_4F_8$. As shown in Table 2, $C_4F_8$ provided silicon carbide etch rates of about 550 to 825 Å/min when the $C_xF_y/N_2$ flow ratio was 2 to 14%. In contrast, $C_5F_8$ provided silicon carbide etch rates of about 180 to 375 Å/min when the $C_xF_y/N_2$ flow ratio was 2 to 14%. $C_4F_6/N_2$ flow ratios of 2 to 17% provided silicon carbide etch rates of about 125 to 375 Å/min.

TABLE 2

SiC Etch Rate (Å/min)

| Flow Ratio $C_xF_y/N_2$ | $C_4F_6 + N_2$ | $C_5F_8 + N_2$ | $C_4F_8 + N_2$ |
| --- | --- | --- | --- |
| 2 | 375 | 375 | 550 |
| 5 | 300 | 375 | 575 |
| 8 | 225 | 300 | 675 |
| 11 | 180 | 225 | 750 |
| 14 | 175 | 180 | 825 |
| 17 | 125 | | |

Table 3 sets forth estimated silicon nitride etch rates obtained when operating the dual frequency reactor at 75 mTorr, 1000 watts power to the top electrode, 1000 watts to the bottom electrode with variations in flow ratio of $C_xF_y/N_2$ using various $C_xF_y$ gases. The $C_xF_y$ gases include $C_4F_6$, $C_5F_8$ and $C_4F_8$. As shown in Table 3, $C_4F_8$ provided silicon nitride etch rates of about 375 to 650 Å/min when the $C_xF_y/N_2$ flow ratio was 2 to 14%. In contrast, $C_5F_8$ provided silicon nitride etch rates of about 150 to 280 Å/min when the $C_xF_y/N_2$ flow ratio was 2 to 14%. $C_4F_6/N_2$ flow ratios of 2 to 17% provided silicon nitride etch rates of about 40 to 250 Å/min.

TABLE 3

SiN Etch Rate (Å/min)

| Flow Ratio $C_xF_y/N_2$ | $C_4F_6 + N_2$ | $C_5F_8 + N_2$ | $C_4F_8 + N_2$ |
| --- | --- | --- | --- |
| 2 | 250 | 280 | 375 |
| 5 | 200 | 265 | 425 |
| 8 | 200 | 250 | 550 |
| 11 | 100 | 200 | 600 |
| 14 | 60 | 150 | 650 |
| 17 | 40 | | |

In another embodiment of the invention, a preferred etch gas includes a mixture of a hydrogen-free fluorocarbon and a hydrogen-containing fluorocarbon. Table 4 sets forth etch gas recipes wherein the hydrogen-free fluorocarbon is $C_4F_8$, the hydrogen-containing fluorocarbon is $CF_2H_2$. Various $C_xF_y/N_2$ flow ratios were evaluated wherein the flow ratios ranged from 6 to 24%.

Table 5 sets forth etch rates of low-k dielectric (CORAL), silicon carbide, silicon nitride and photoresist (PR) using the etch gas chemistries set forth in Table 4. Table 5 also sets forth selectivities of etch rates of: low-k dielectric to silicon carbide (SiC Sel.), low-k dielectric (LKD) to silicon nitride (SiN Sel.) and low-k dielectric to photoresist (PR Sel.). As shown in Table 5, selectivities above 5 for silicon carbide, silicon nitride and photoresist were obtained using etch gas chemistries for Run Nos. 1, 2, 3 and 9 wherein the $C_xF_y/N_2$ flow ratio ranged from 6 to 24%. Run No. 2 provided selectivities with respect to silicon carbide, silicon nitride and photoresist of over 10, the selectivity with respect to the photoresist being over 15.

TABLE 4

Low-k Dielectric Etch Gas Flow Rates (sccm)

| Run | Ar | $C_4F_8$ | $CF_2H_2$ | $O_2$ | $N_2$ | $C_xF_4/N_2$ |
| --- | --- | --- | --- | --- | --- | --- |
| 1 | 130 | 12 | 6 | 5 | 150 | 12% |
| 2 | 205 | 12 | 6 | 0 | 75 | 24% |
| 3 | 130 | 6 | 3 | 0 | 150 | 6% |
| 4 | 205 | 6 | 3 | 5 | 75 | 6% |
| 5 | 130 | 6 | 12 | 0 | 150 | 12% |
| 6 | 205 | 6 | 12 | 5 | 75 | 24% |
| 7 | 130 | 3 | 6 | 5 | 150 | 6% |
| 8 | 205 | 3 | 6 | 0 | 75 | 12% |
| 9 | 173 | 7.5 | 7.5 | 2.5 | 107 | 14% |

TABLE 5

Etch Rates (Å/min)

| Run | LKD | SiC | SiN | PR | SiC Sel. | SiN Sel. | PR Sel. |
| --- | --- | --- | --- | --- | --- | --- | --- |
| 1 | 5916 | 1094 | 553 | 950 | 5.4 | 10.7 | 6.2 |
| 2 | 7386 | 625 | 553 | 410 | 11.8 | 13.4 | 18.0 |
| 3 | 3194 | 582 | 583 | 567 | 5.5 | 5.5 | 5.6 |
| 4 | 3059 | 830 | 1046 | 668 | 3.7 | 2.9 | 4.6 |
| 5 | 2890 | 630 | 1568 | 300 | 4.6 | 1.8 | 9.6 |
| 6 | 3654 | 592 | 1663 | 482 | 6.2 | 2.2 | 7.6 |
| 7 | 1876 | 1079 | 669 | 1048 | 1.7 | 2.8 | 1.8 |
| 8 | 2307 | 356 | 859 | 183 | 6.5 | 2.7 | 12.6 |
| 9 | 4109 | 579 | 692 | 480 | 7.1 | 5.9 | 8.6 |

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A process for etching a low-k dielectric layer with selectivity to an overlying mask layer, comprising the steps of:

supporting a semiconductor substrate in a chamber of a plasma etch reactor, the semiconductor substrate having a low-k dielectric layer of a carbon-doped glass low-k material and an overlying mask layer;

supplying an oxygen-free single-fluorocarbon etching gas to the chamber and energizing the etching gas into a plasma state, the etching gas consisting essentially of $N_2$, $C_5F_8$, and optional carrier gas, wherein a flow ratio of $C_5F_8$ to the $N_2$ is 3 to 7%;

etching exposed portions of the low-k dielectric layer with the plasma so as to etch openings in the low-k dielectric layer with the plasma while providing a etch rate selectivity of the etching rate of the low-k dielectric layer to the etching rate of the mask layer of at least about 5, wherein the plasma etch reactor comprises a dual frequency parallel plate plasma reactor having a showerhead electrode and a bottom electrode on which the substrate is supported.

2. The process of claim 1, wherein the low-k dielectric layer is above an underlying silicon carbide layer, the etching rate of the low-k dielectric layer being at least 5 times faster than the etching rate of the silicon carbide layer.

3. The process of claim 1, wherein the low-k dielectric layer is above an underlying silicon nitride layer, the etching rate of the low-k dielectric layer being at least 5 times faster than the etching rate of the silicon nitride layer.

4. The process of claim 1, wherein the openings are 0.25 micron or smaller sized openings.

5. The process of claim 1, wherein the etching gas includes a carrier gas selected from the group consisting of Ar, He, Ne, Kr, Xe and mixtures thereof.

6. The process of claim 1, wherein the bottom electrode is supplied RF energy at two different frequencies or the showerhead electrode is supplied RF energy at a first frequency and the bottom electrode is supplied RF energy at a second frequency which is different than the first frequency.

7. The process of claim 1, wherein the fluorocarbon reactant is supplied to the chamber at a flow rate of 3 to 30 sccm and the nitrogen reactant is supplied to the chamber at a flow rate of 50 to 300 sccm.

8. The process of claim 1, further comprising applying an RF bias to the semiconductor substrate during the etching step.

9. The process of claim 1, further comprising filling the openings with metal after the etching step.

10. The process of claim 1, wherein the etching step is carried out as part of a process of manufacturing a damascene structure.

11. The process of claim 1, wherein the openings are formed with an aspect ratio of at least 5:1.

12. The process of claim 1, wherein the plasma reactor is at a pressure of 50 to 500 mTorr during the etching step.

13. The process of claim 1, wherein the semiconductor substrate comprises a silicon wafer supported on a substrate support and the substrate support is maintained at a temperature of 20 to 50° C. during the etching step.

14. The process of claim 1, wherein the mask layer comprises a silicon-containing film selected from the group consisting of a doped oxide, undoped oxide, silicon nitride, silicon carbide, silicon oxynitride and combinations thereof.

15. The process of claim 1, wherein the openings have substantially straight walls.

16. The process of claim 1, wherein the low-k dielectric layer overlies an electrically conductive layer comprising a metal-containing layer selected from the group consisting of aluminum or alloy thereof, copper or alloy thereof, titanium or alloy thereof, tungsten or alloy thereof, molybdenum or alloy thereof, titanium nitride, titanium silicide, tungsten silicide, cobalt silicide, and molybdenum silicide.

17. The process of claim 1, wherein the low-k dielectric layer overlies a semiconductive layer selected from the group consisting of doped and undoped polycrystalline and single crystal silicon.

18. The process of claim 1, further comprising steps of forming a photoresist layer above the mask layer, patterning the photoresist layer to form a plurality of the openings, etching through the mask, the etching step forming via or contact openings in the low-k dielectric layer at locations where the mask is etched through.

19. The process of claim 18, wherein etch rate selectivity of the etching rate of the low-k dielectric layer to the etching rate of the photoresist layer is at least about 5.

20. A process for etching a low-k dielectric layer with selectivity to an overlying mask layer, comprising the steps of:

supporting a semiconductor substrate in a chamber of a plasma etch reactor, the semiconductor substrate having a low-k dielectric layer of a doped glass low-k material and an overlying mask layer of silicon carbide or silicon nitride;

supplying an oxygen-free etching gas to the chamber and energizing the etching gas into a plasma state, the etching gas consisting essentially of $C_4F_8$, $CF_2H_2$, $N_2$, and optionally Ar, the $C_4F_8$, $CF_2H_2$ and $N_2$ being supplied to the chamber at flow rates such that the total $C_4F_8$ and $CF_2H_2$ flow rate is 30% or less of the $N_2$ flow rate; and etching exposed portions of the low-k dielectric layer with the plasma so as to etch openings in the low-k dielectric layer with the plasma while providing a etch rate selectivity of the etching rate of the low-k dielectric layer to the etching rate of the mask layer of at least about 5.

21. The process of claim 20, wherein the flow rate of the $CF_2H_2$ is less than or equal to the flow rate of the $C_4F_8$.

22. The process of claim 20, wherein the plasma etch reactor has a showerhead electrode and a bottom electrode on which the substrate is supported, the bottom electrode is supplied RF energy at two different frequencies or the showerhead electrode is supplied RF energy at a first frequency and the bottom electrode is supplied RF energy at a second frequency which is different than the first frequency.

23. The process of claim 20, wherein the doped glass low-k material is carbon-doped.

* * * * *